United States Patent
Wu

(10) Patent No.: US 6,502,956 B1
(45) Date of Patent: Jan. 7, 2003

(54) LIGHT EMITTING DIODE LAMP WITH INDIVIDUAL LED LENSES

(75) Inventor: Chen H. Wu, Los Altos Hills, CA (US)

(73) Assignee: Leotek Electronics Corporation, Taipei Hsien (TW)

( * ) Notice: Subject to any disclaimer, the term of this patent is extended or adjusted under 35 U.S.C. 154(b) by 0 days.

(21) Appl. No.: 09/277,091

(22) Filed: Mar. 25, 1999

(51) Int. Cl.[7] .................................................. F21V 7/10
(52) U.S. Cl. .................... 362/237; 362/255; 362/245; 362/800
(58) Field of Search .................. 362/236, 244, 362/245, 327, 335, 339, 255, 240, 545, 396, 368; 313/500, 512

(56) References Cited

U.S. PATENT DOCUMENTS

| | | | |
|---|---|---|---|
| 4,013,915 A | * 3/1977 | Dufft | 313/499 |
| 4,298,869 A | 11/1981 | Okuno | 345/82 |
| 4,419,722 A | * 12/1983 | Bury | 362/396 |
| 4,507,718 A | * 3/1985 | Bury | 362/396 |
| 4,682,147 A | 7/1987 | Bowman | 340/815.45 |
| 4,868,719 A | * 9/1989 | Kouchi | 362/545 |
| 4,887,074 A | 12/1989 | Simon et al. | 345/82 |
| 5,040,320 A | 8/1991 | Reidinger | 40/570 |
| 5,066,889 A | * 11/1991 | Edwards | 313/512 |
| 5,388,357 A | 2/1995 | Malita | 40/570 |
| 5,410,453 A | 4/1995 | Ruskouski | 362/20 |
| 5,416,679 A | 5/1995 | Ruskouski et al. | 362/240 |
| 5,428,912 A | 7/1995 | Grondal et al. | 40/570 |
| 5,459,955 A | 10/1995 | Ruskouski et al. | 40/570 |
| 5,463,280 A | 10/1995 | Johnson | 315/187 |
| 5,526,236 A | 6/1996 | Burnes et al. | 362/20 |
| 5,561,346 A | 10/1996 | Byrne | 313/512 |
| 5,593,223 A | * 1/1997 | Koizumi | 362/255 |
| 5,632,551 A | * 5/1997 | Roney | 362/485 |
| 5,655,830 A | 8/1997 | Ruskouski | 362/240 |
| 5,688,042 A | 11/1997 | Madadi et al. | 362/240 |
| 5,726,535 A | 3/1998 | Yan | 315/185 R |
| 5,729,925 A | 3/1998 | Prothero | 40/570 |
| 5,742,120 A | * 4/1998 | Lin | 313/512 |
| 5,890,794 A | 4/1999 | Abtahi et al. | 362/294 |
| 5,939,996 A | * 8/1999 | Kniveton | 340/815.4 |
| 6,048,082 A | * 4/2000 | Washimoto | 362/310 |
| 6,158,156 A | * 12/2000 | Patrick | 40/443 |

FOREIGN PATENT DOCUMENTS

JP          10-322053      * 4/1998

OTHER PUBLICATIONS

Quantum Lamps, Ameratech R&D Inc. & Leotek Inc. product information sheet, 2 pages, Pub. Feb. 1992.

(List continued on next page.)

Primary Examiner—Sandra O'Shea
Assistant Examiner—Hargobind S. Sawhney
(74) Attorney, Agent, or Firm—Gray Cary Ware & Freidenrich LLP

(57) ABSTRACT

An LED lamp including a housing, a circuit board mounted to the housing, an electrical connector attached to the housing and electrically connected to the circuit board, a plurality of LEDs mounted to the circuit board that are activated to emit a light output when an electrical voltage is applied to the electrical connector, and a plurality of LED covers each mounted to cover one of the plurality of LEDs. Each LED cover includes a lens portion that redirects the light output from the one LED, and a side portion that attaches to either the PCB or the LED to secure the LED cover in place. The LED covers can be individually movable or replaced to modify the overall distribution pattern of the LED lamp.

24 Claims, 7 Drawing Sheets

OTHER PUBLICATIONS

Maintenance–Free L.E.D. Exit Sign, Leotek Electronics Corporation product information sheet, 2 pages, Pub. 1995.

Leotek Lamps, Leotek Electronics Corporation product information sheet, 2 pages, Pub. Aug., 1996.

Leotek Open Signs, Leotek Electronics Corporation product information sheet, 2 pages, Pub. 1996.

Astralite 2000, Astralite product information sheet, 2 pages, Pub. 1994.

T6.5 Ultra Lite, Halco Lighting Corporation product information sheet, 1 page, Pub. 1995.

Redhead LED Exit Lamp, TCP product information sheet, 1 page, Pub. 1995.

E–Z Lamp, Isolite Corp. product information sheet, 2 pages, Pub. 1995.

Exbrite Exit Retrofit, Conservalite Technologies, Inc. product information sheet, 1 page, Pub. Apr. 1996.

Bright Idea, Standard Enterprises, Inc., product information sheet, 2 pages, Pub. Mar., 1996.

Universal T Lamp, Area Lighting Research, Inc. product information sheet, 2 pages, Pub. Apr. 1996.

Wattman LED Exit Retrofit Lamp, Standard Enterprises Inc., product information sheet, 2 pages, Pub. 1995.

* cited by examiner

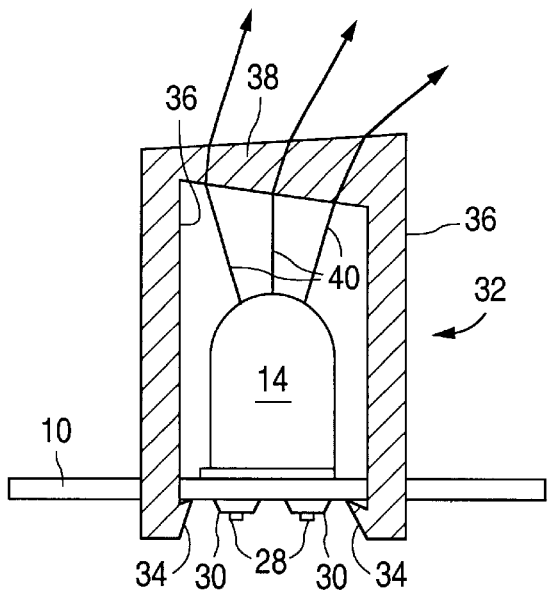
FIG. 2
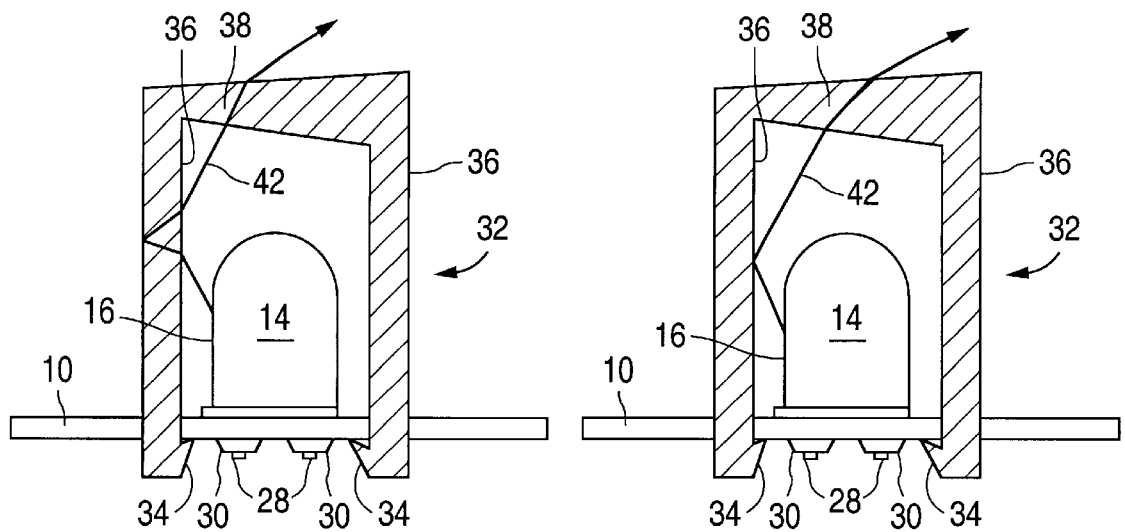
FIG. 3A  FIG. 3B

LIGHT EMITTING DIODE LAMP WITH INDIVIDUAL LED LENSES

FIELD OF THE INVENTION

The present invention relates to light emitting diode (LED) lamps, and more particularly to individual lenses to redirect light from LED lamps for various applications, such as LED traffic signal lamps, LED display boards, LED light bulbs, LED clusters, and LED signs.

BACKGROUND OF THE INVENTION

Light Emitting Diode (LED) lamps have been developed to replace the conventional incandescent or fluorescent lamps to reduce electrical cost and increase reliability. LED lamps consume less energy than convention lamps while exhibiting much longer lifetimes. Such lamps are typically made by mounting a plurality of LEDs to a flat printed circuit board (PCB), with the flat surface of the PCB on which the LEDs are mounted facing toward the desired direction of the light output.

Typical LEDs are manufactured to emit most of their light output primarily in the axial direction of the LED, and within a relatively small viewing angle. Therefore, lamps with a flat PCB primarily emit light in a direction perpendicular to the flat surface on which the LEDs are mounted.

There are certain applications, however, where it is desired to direct at least some of the light output away from, and possibly unsymmetrically with respect to, the axial direction of the LEDs. For example, overhead traffic signal LED lamps face parallel to the ground and therefore emit most of the light output parallel to the roadway, which is viewable by drivers located far away from the intersection. However, not much light is directed downwardly toward drivers closer to or at the intersection.

Another drawback of LED lamps is that a significant amount of light is also emitted out the sides of each LED. This side emitted light is wasted because it is not directed into the desired viewing angle of the LED lamp.

Oval LEDs have been developed to try and direct the light from the LED lamp in a larger, unsymmetrical viewing angle (i.e. evenly along the roadway for a traffic signal LED lamp). However, oval LEDs are often too complex and costly to manufacture and/or assemble. Further, the LEDs and the LED lamp must be carefully oriented to direct the light in the desired directions. Variable adjustment of the light distribution pattern is not possible.

Lens designs have also been used to direct the LED output distribution in a more desirable way. For example, U.S. Pat. Nos. 5,636,057, 5,174,649 and 5,833,355 disclose single prismatic toroidal lenses in front of an LED array to direct the light toward a plurality of predetermined, distinct spatial points. Each lens piece consists of many elements that line up with the individual LEDs. The design of such elements can vary depending on the application. However, such lenses are not versatile. If the desired output distribution changes, or if the LED lamp configuration changes (i.e. changing the number or arrangement of LEDs), the lenses must be redesigned and replaced. There simply is no way to make minor adjustments to the light distribution as the need arises, which is a problem because as LED technology improves, the arrangement and the number of LEDs used in many applications, such as traffic signal lights, will change. In addition, the lens must be precisely aligned to the LED lamp for maximum effect so that the individual elements are properly aligned to the corresponding LED output. Another drawback with such lens designs is that, for certain applications such as a very large display board, manufacturing a large piece of lens becomes impractical.

There is a need for an LED lamp lens design that can efficiently, and preferably adjustably, redirect the output of LEDs without having to use a single lens structure for the entire LED lamp. Such a lens design should accommodate changes in the desired output distribution pattern from the lamp, or changes in the number and arrangement of LEDs, as the needs of a particular application change.

SUMMARY OF THE INVENTION

The present invention solves the aforementioned problems by providing each individual light emitting diode (LED) with a lens tailored to fit each specific application.

The LED lamp of the present invention includes a circuit board, a plurality of LEDs mounted to the circuit board that when activated emit a light output, and a plurality of LED covers each mounted to cover one of the plurality of LEDs. Each LED cover includes a lens portion that redirects the light output from the one LED.

In another aspect of the present invention, the LED lamp of the present invention includes a housing, a circuit board mounted to the housing, an electrical connector attached to the housing and electrically connected to the circuit board, a plurality of LEDs mounted to the circuit board that are activated to emit a light output when an electrical voltage is applied to the electrical connector, and a plurality of LED covers each mounted to cover one of the plurality of LEDs. EachLED cover includes a lens portion that redirects the light output from the one LED, and a side portion that attaches to one of the PCB and the one LED to secure the LED cover in place.

Other objects and features of the present invention will become apparent by a review of the specification, claims and appended figures.

BRIEF DESCRIPTION OF THE DRAWINGS

FIG. 2 is a side cross-sectional view of the LED and LED cover of the present invention.

FIG. 3A is a side cross-sectional view of the LED and LED cover of the present invention, particularly illustrating the reflective qualities of the outer surface of the LED cover side portion.

FIG. 3B is a side cross-sectional view of the LED and LED cover of the present invention, particularly illustrating the reflective qualities of the inner surface of the LED cover side portion.

DETAILED DESCRIPTION OF THE PREFERRED EMBODIMENTS

Figure 1A:
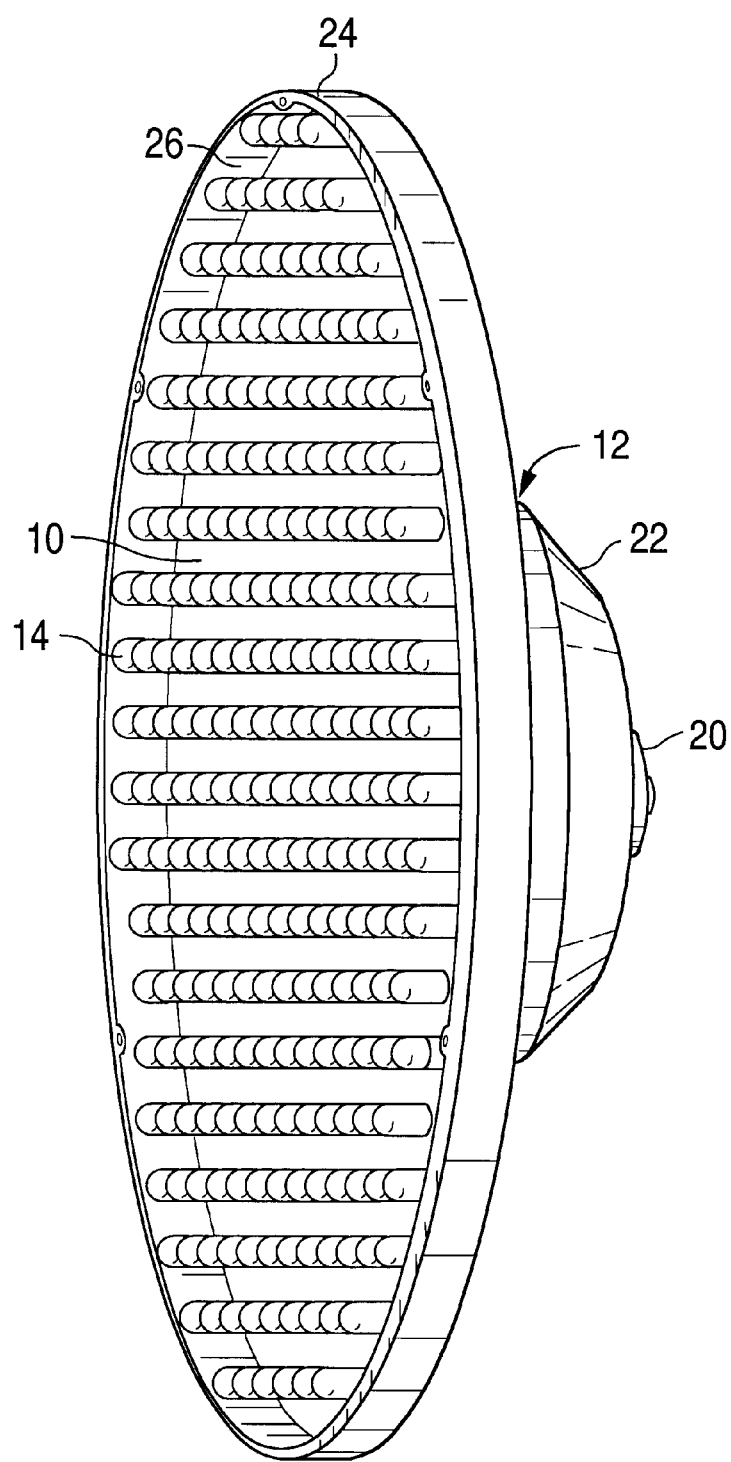
FIG. 1A is a perspective view of the LED lamp, without the LED covers, of the present invention.
Figure 1B:
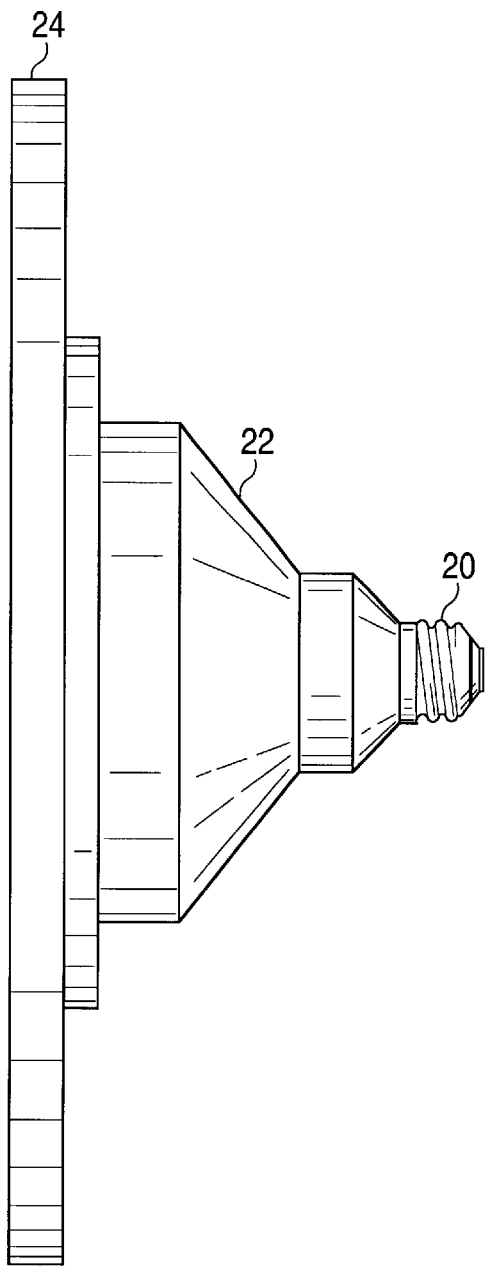
FIG. 1B is a side view of the LED lamp of the present invention.

The present invention is a light emitting diode (LED) lamp that provides a redirected, and possibly adjustable, light distribution pattern. The LED lamp of the present invention includes a printed circuit board (PCB) 10, a housing 12 and a plurality of LEDs 14, as illustrated in FIGS. 1A–B and 2. The housing 12 includes a threaded electrical connector 20 that engages a standard light socket, a central housing portion 22 that contains a power supply therein (not shown), and a rim portion 24 which defines a PCB cavity 26.

The PCB 10 is mounted into the PCB cavity 26 and includes a plurality of electrical sockets into which the plurality of LEDs 14 are mounted. The electrical leads 28 of LEDs 14 are electrically mounted to the PCB 10 by solder 30. The electrical connector 20 is connected to the power supply, which supplies electrical power to the LEDs 14 via PCB 10.

Each LED 14 includes an LED cover 32, as best shown in FIG. 2, that is disposed over the LED 14. The LED cover 32 includes a side portion 36 and a lens portion 38. Clip portion(s) 34 are formed at the end of the side portion 36 to secure the LED cover 32 to the PCB 10.

When the LED 14 is electrically activated, it produces a primary light output 40 in the axial direction of the LED and within a relatively small viewing angle. Lens portion 38 of LED cover 32 is specially shaped to redirect (focus) the primary light output 40 to have a desired light distribution pattern (direction and spatial spread). In the case of a traffic lamp, the desired light distribution would be a straight ahead and downward toward the road, with limited light directed to the sides or upwardly away from the road.

Additionally, the LED 14 produces a secondary light output 42 out its side portion 16, as illustrated in FIGS. 3A–B. The secondary light output 42 is typically much lower in intensity than the primary light output 40, and is therefore often discarded by LED lamps as wasted output. However, with the LED cover 32 of the present invention, the side portion 36 is used to redirect the secondary light output 42 toward the lens portion 38, where it can be combined with the primarily light output 40 for increased luminosity. The side portion outside surface (FIG. 3A) or inside surface (FIG. 3B), or both, reflect the secondary light output 42 toward the lens portion 38. Reflecting coatings can be added to the inside and/or outside surfaces of the side portion 36 to enhance these light reflections.

The LED covers 32 are tailored to easily mount over each LED, which avoids the need to manufacture a large piece of lens consisting of many elements (which cannot be reused if the LED arrangement or desired light distribution pattern is changed). LED covers 32 are usable on LED displays of all sizes, are low cost, and offer great flexibility in that they are suitable for many different applications. LED covers 32 having different shaped lens portions 38 can be used on LEDs in the same LED lamp. Thus, some LED light outputs can be directed in one direction with one given spatial spread, while other LED light outputs from the same lamp can be directed in a different directions with differing spatial spreads. Moreover, the overall LED lamp output distribution can be modified by selectively replacing some of the lens covers 32 with other lens covers 32 having differently shaped lens portions 38. In fact, as described below, the individual LED covers 32 can be mounted in a manner so that they can be rotated to modify the LED lamp output distribution pattern.

Figure 4A:
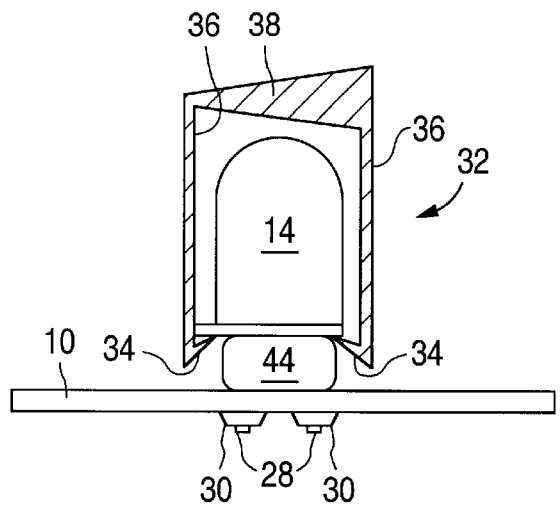
FIG. 4A is a side cross-sectional view of the LED and LED cover of a first alternate embodiment of the present invention.
Figure 4B:
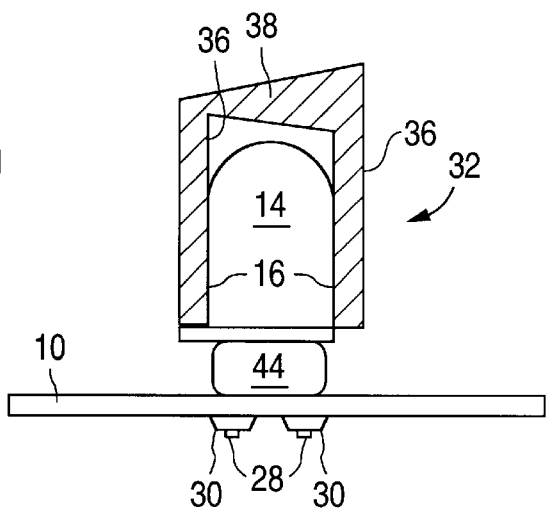
FIG. 4B is a side cross-sectional view of the LED and LED cover of a second alternate embodiment of the present invention.
Figure 5A:
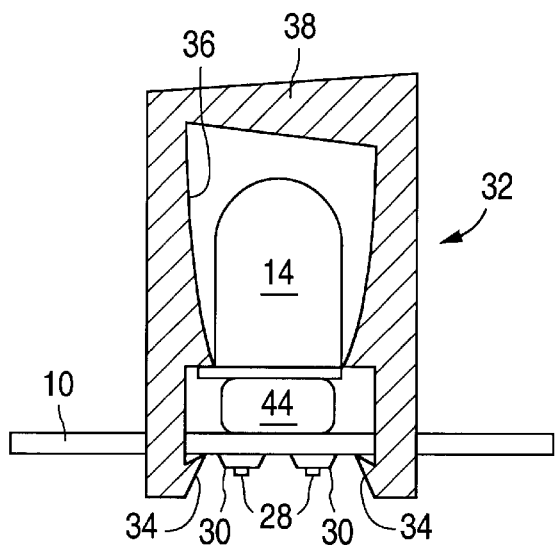
FIG. 5A is a side cross-sectional view of the LED and LED cover of a third alternate embodiment of the present invention.
Figure 5B:
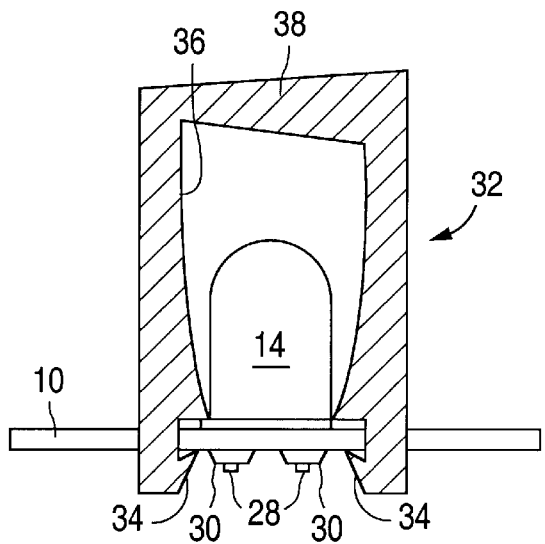
FIG. 5B is a side cross-sectional view of the LED and LED cover of a fourth alternate embodiment of the present invention.
Figure 5C:
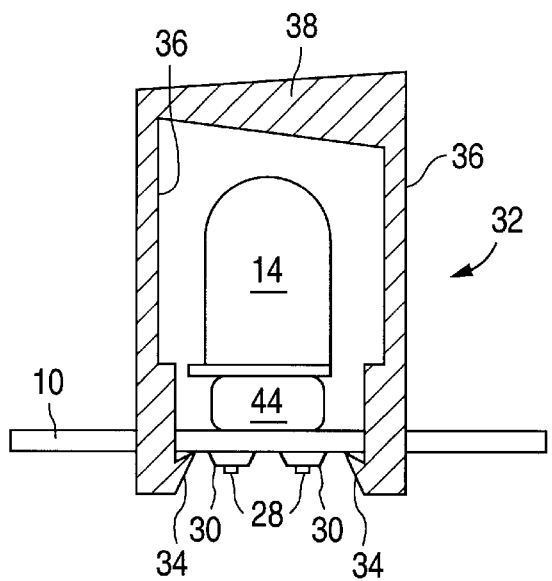
FIG. 5C is a side cross-sectional view of the LED and LED cover of a fifth alternate embodiment of the present invention.
Figure 5D:
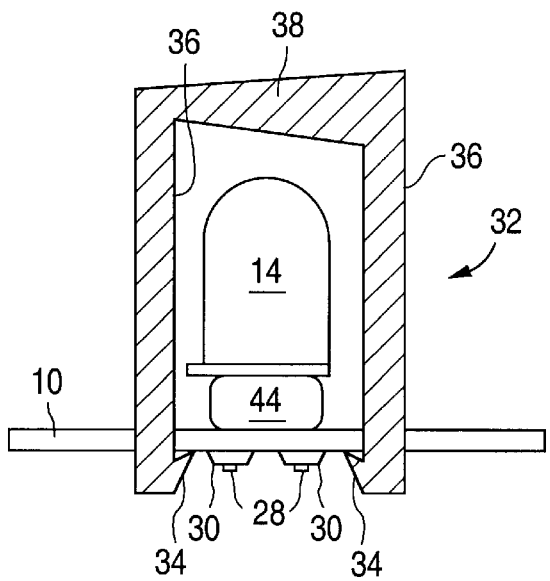
FIG. 5D is a side cross-sectional view of the LED and LED cover of a sixth alternate embodiment of the present invention.

There are various manners in which the LED covers 32 are mounted to the LED lamps. For example, FIG. 4A shows a spacer 44 disposed between the LED 14 and PCB 10, where the LED cover clip portion(s) 34 engage the underside of the LED 14 instead of the PCB 10. This configuration allows rotation of the LED cover 32 to alter the LED output distribution pattern. Likewise, FIG. 4B shows the LED cover side portion 36 affixed to the side portion 16 of the LED 14 by a friction fit.

Figure 6A:
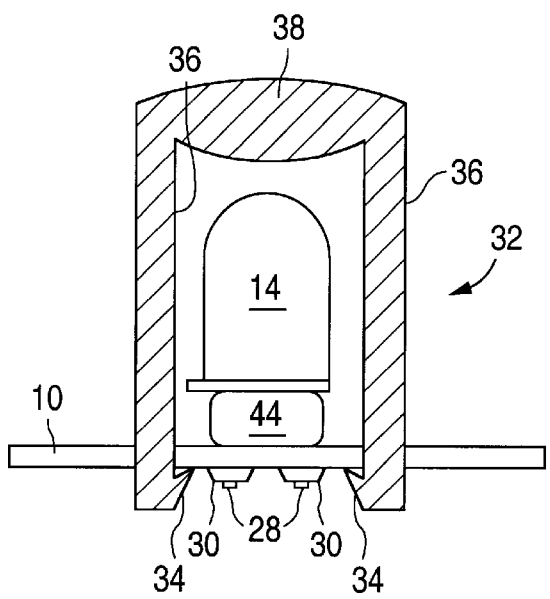
FIG. 6A is a side cross-sectional view of the LED and LED cover of a seventh alternate embodiment of the present invention.
Figure 6B:
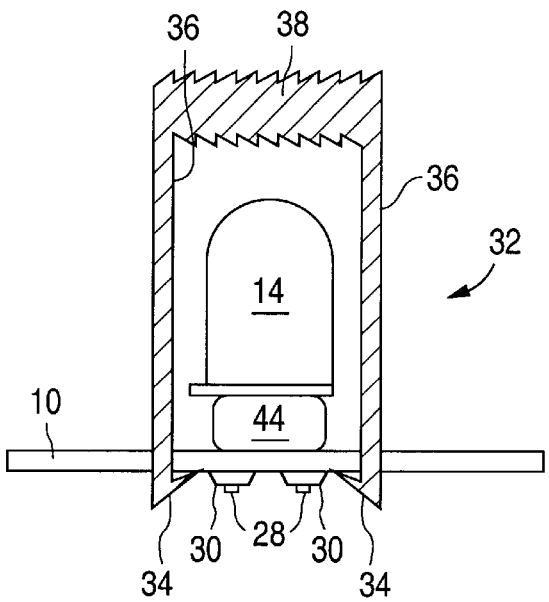
FIG. 6B is a side cross-sectional view of the LED and LED cover of a eighth alternate embodiment of the present invention.
Figure 6C:
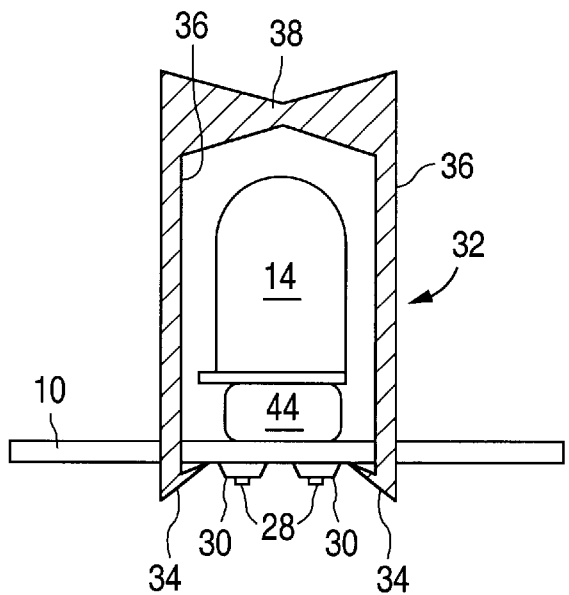
FIG. 6C is a side cross-sectional view of the LED and LED cover of a ninth alternate embodiment of the present invention.
Figure 7:
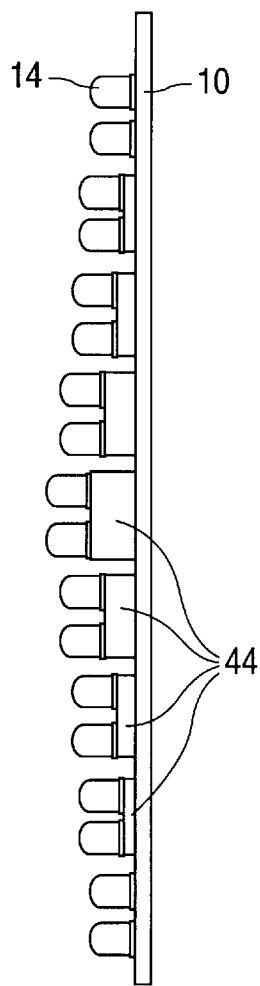
FIG. 7 is a side cross-sectional view of the LED lamp of the present invention, with spacers having variable height.
Figure 8A:
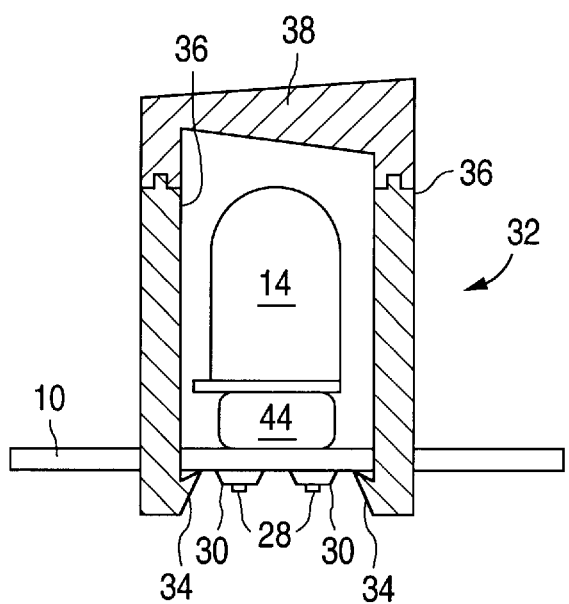
FIG. 8A is a side cross-sectional view of the LED and LED cover of a tenth alternate embodiment of the present invention.
Figure 8B:
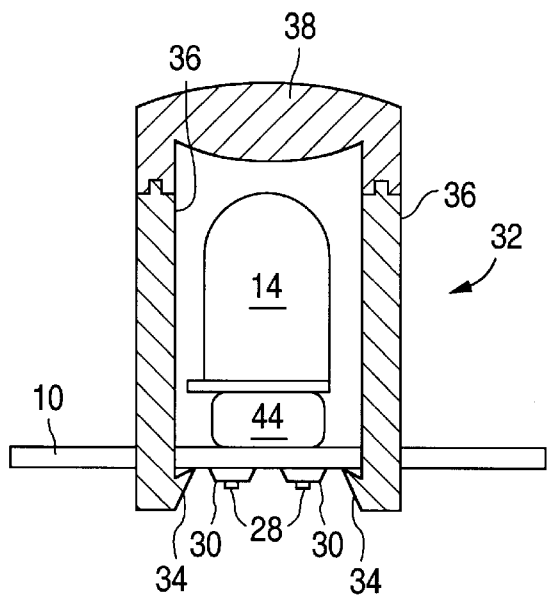
FIG. 8B is a side cross-sectional view of the LED and LED cover of a eleventh alternate embodiment of the present invention.
Figure 8C:
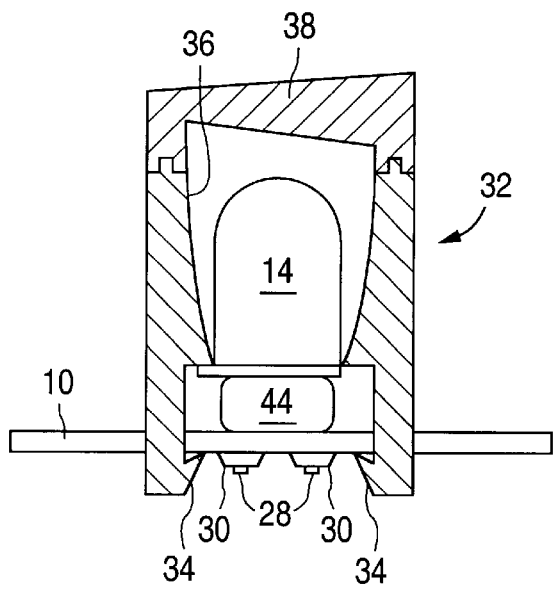
FIG. 8C is a side cross-sectional view of the LED and LED cover of a twelfth alternate embodiment of the present invention.
Figure 8D:
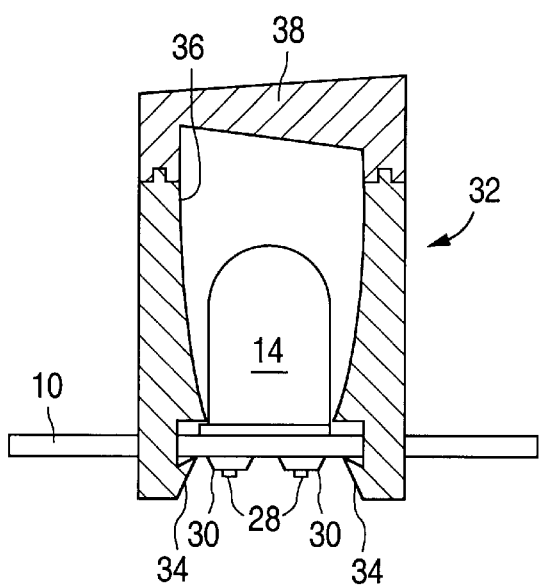
FIG. 8D is a side cross-sectional view of the LED and LED cover of a thirteenth alternate embodiment of the present invention.

The shape and size of LED cover 32 can be varied to provide the desired distribution of light output from the LED 14, including mixing various shapes and sizes of LED covers 32 in a single LED lamp. For example, FIGS. 5A–5D illustrate various shaped side portions 36, which affects how the secondary. light output 42 is reflected out of LED cover 32, and how LED cover 32 attaches to the LED 14. FIGS. 6A–6C illustrate various shaped lens portions 38, which dictates the light distribution pattern emanating therefrom. EVen the size of spacers 44 used in a single LED lamp can be varied, as illustrated in FIG. 7, so that the height of each individual LED in a signal light can be different (e.g. in order for the LED positions to match the curved shape of an existing lamp cover).

While the above described embodiments of the LED covers 32 are illustrated as single piece elements, they could also be designed as multiple piece elements, where the lens portion 38 removably, semi-permanently or permanently attaches to the side portion 36. For example, FIGS. 8A–8D illustrate different shaped lens portions 38 that are removably, semi-permanently or permanently attached to the side portions 36. Thus, if the connection between the lens and side portions 38/36 is not permanent, then lens portion 38 can be replaced to modify the light distribution pattern without having to remove the side portion 36 (which could be permanently or semi-permanently mounted to the LED 14 or PCB 10).

Figure 9:
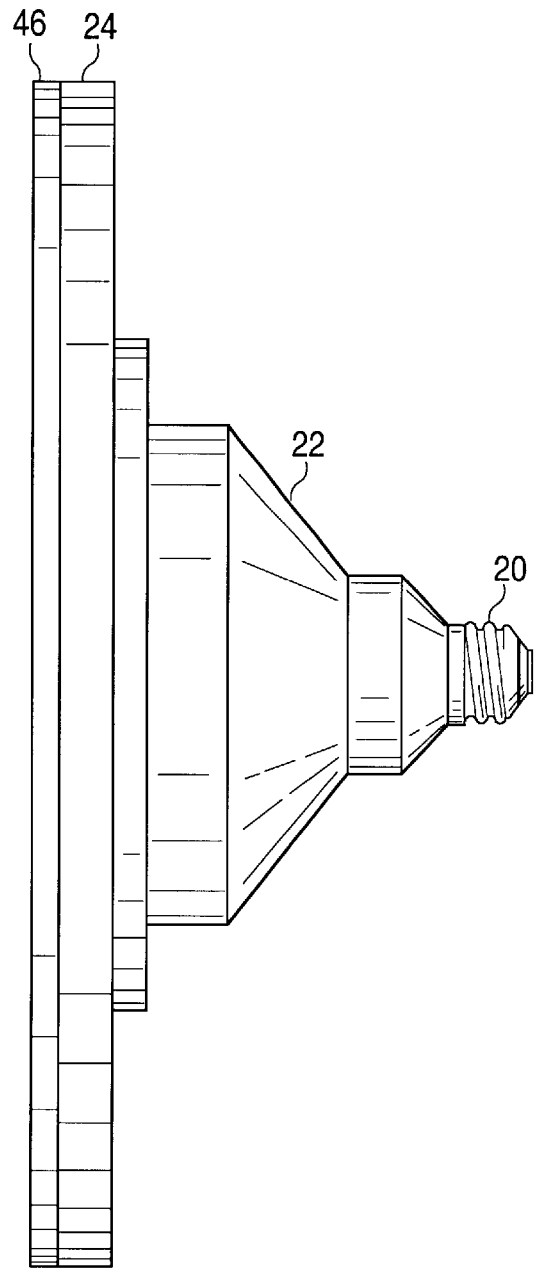
FIG. 9 is a side view of the LED lamp of the present invention together with the transparent plate thereover.

FIG. 9 illustrates a transparent plate 46 that mounts over the rim portion 24 to protect the LEDs 14 and LED covers 32 underneath. Plate 46 can be color tinted, and can have opaque portions to form illuminated symbol images such as arrows, letters, numbers, etc.

With the LED covers of the present invention, the output of each LED can be modified individually. Thus, changes in the desired output, number of LEDs, and/or locations of LEDs are simply addressed by moving or changing the LED covers 32. The LED covers 32 also capture light emitted from the side portion 16 of the LED which is normally wasted, and redirect this light to maximize illumination in the desired directions and spatial spread, which for many applications can be critical.

It is to be understood that the present invention is not limited to the embodiments described above and illustrated herein, but encompasses any and all variations falling within the scope of the appended claims. For example, the PCB need not be flat, and can be any circuit board or other rigid member that secures the LEDs in place and supplies power to the LEDs. Further, a different lamp housing design and/or electrical connector can be used. Moreover, the various portions of the LED cover 32 (clip, side, lens) can be symmetric or non-symmetric as desired. Lastly, any of the above described side/lens portion shapes and mounting configurations can be combined with others to form the desired lens covers 32 of the present invention.

What is claimed is:

1. An LED lamp, comprising:

a circuit board;

a plurality of LEDs mounted to the circuit board that when activated emit a light output; and a plurality of LED covers each mounted to cover one of the plurality of LEDs, each LED cover including a lens portion that redirects the light output from the one LED;

wherein each of the plurality of LED covers includes a side portion that attaches to the circuit board to secure the LED cover in place;

wherein the light output is redirected asymmetrically by the lens portions, and wherein for each of the plurality of LED covers, the side portion is movably attached to the circuit board so that a light distribution pattern emanating therefrom can be adjusted by moving the LED cover.

2. An LED lamp, comprising:

a circuit board;

a plurality of LEDs mounted to the circuit board that when activated emit a light output;

a plurality of LED covers each mounted to cover one of the plurality of LEDs, each LED cover including a lens portion that redirects the light output from the one LED;

wherein each of the plurality of LED covers includes a side portion that attaches to the circuit board to secure the LED cover in place; and a plurality of spacers each disposed between one of the LEDs and the circuit board.

3. The LED lamp of claim 2, wherein the plurality of spacers have various heights so that the LEDs are disposed at various heights above the circuit board.

4. An LED lamp, comprising:

a circuit board;

a plurality of LEDs mounted to the circuit board that when activated emit a light output; and a plurality of LED covers each mounted to cover one of the plurality of LEDs, each LED cover including a lens portion that redirects the light output from the one LED;

wherein each of the plurality of LED covers includes a side portion that attaches to the circuit board to secure the LED cover in place, and wherein at least two of the LED covers have lens portions that are shaped differently from each other in order to create different light distribution patterns emanating therefrom.

5. An LED lamp, comprising:

a circuit board;

a plurality of LEDs mounted to the circuit board that when activated emit a light output; and a plurality of LED covers each mounted to cover one of the plurality of LEDs, each LED cover including a lens portion that redirects the light output from the one LED;

wherein each of the plurality of LED covers includes a side portion that attaches to the circuit board to secure the LED cover in place, and wherein for each LED cover, the side portion and the lens portion are separate elements attached to each other.

6. An LED lamp, comprising:

a circuit board;

a plurality of LEDs mounted to the circuit board that when activated emit a light output; and a plurality of LED covers each mounted to cover one of the plurality of LEDs, each LED cover including a lens portion that redirects the light output from the one LED;

wherein each of the plurality of LED covers includes a side portion that attaches to the circuit board to secure the LED cover in place, and wherein for each LED cover, the side portion and the lens portion are are separate elements that are movably attached to each other.

7. An LED lamp, comprising:

a housing;

a circuit board mounted to the housing;

an electrical connector attached to the housing and electrically connected to the circuit board;

a plurality of LEDs mounted to the circuit board that are activated to emit a light output when an electrical voltage is applied to the electrical connector; and a plurality of LED covers each mounted to cover one of the plurality of LEDs, each LED cover including:

a lens portion that redirects the light output from the one LED, and a side portion that attaches to the circuit board to secure the LED cover in place;

wherein the light output is redirected asymmetrically by the lens portions, and wherein for each of the plurality of LED covers, the side portion is movably attached to the circuit board so that a light distribution pattern emanating therefrom can be adjusted by moving the LED cover.

8. An LED lamp, comprising:

a housing;

a circuit board mounted to the housing;

an electrical connector attached to the housing and electrically connected to the circuit board;

a plurality of LEDs mounted to the circuit board that are activated to emit a light output when an electrical voltage is applied to the electrical connector; and a plurality of LED covers each mounted to cover one of the plurality of LEDs, each LED cover including:
   a lens portion that redirects the light output from the one LED, and
   a side portion that attaches to the circuit board to secure the LED cover in place; and a plurality of spacers each disposed between one of the LEDs and the circuit board.

9. The LED lamp of claim 8, wherein the plurality of spacers have various heights so that the LEDs are disposed at various heights above the circuit board.

10. An LED lamp, comprising:
a housing;
a circuit board mounted to the housing;
an electrical connector attached to the housing and electrically connected to the circuit board;
a plurality of LEDs mounted to the circuit board that are activated to emit a light output when an electrical voltage is applied to the electrical connector; and
a plurality of LED covers each mounted to cover one of the plurality of LEDs, each LED cover including:
   a lens portion that redirects the light output from the one LED, and
   a side portion that attaches to the circuit board to secure the LED cover in place;
wherein at least two of the LED covers have lens portions that are shaped differently from each other in order to create different light distribution patterns emanating therefrom.

11. An LED lamp, comprising:
a housing;
a circuit board mounted to the housing;
an electrical connector attached to the housing and electrically connected to the circuit board;
a plurality of LEDs mounted to the circuit board that are activated to emit a light output when an electrical voltage is applied to the electrical connector; and
a plurality of LED covers each mounted to cover one of the plurality of LEDs, each LED cover including:
   a lens portion that redirects the light output from the one LED, and
   a side portion that attaches to the circuit board to secure the LED cover in place;
wherein for each LED cover, the side portion and the lens portion are separate elements attached to each other.

12. An LED lamp, comprising:
a housing;
a circuit board mounted to the housing;
an electrical connector attached to the housing and electrically connected to the circuit board;
a plurality of LEDs mounted to the circuit board that are activated to emit a light output when an electrical voltage is applied to the electrical connector; and
a plurality of LED covers each mounted to cover one of the plurality of LEDs, each LED cover including:
   a lens portion that redirects the light output from the one LED, and
   a side portion that attaches to the circuit board to secure the LED cover in place;
   wherein for each LED cover, the side portion and the lens portion are movably attached to each other.

13. An LED lamp, comprising:
a circuit board;
a plurality of LEDs mounted to the circuit board that when activated emit a light output; and
a plurality of LED covers each mounted to cover one of the plurality of LEDs, each LED cover including a lens portion that asymmetrically redirects the light output from the one LED;
wherein each of the plurality of LED covers includes a side portion that movably attaches to the LED so that the LED cover can be rotated relative to the LED to modify the asymmetrical redirection of the light output from the LED.

14. The LED lamp of claim 13, wherein the side portion of each LED cover engages with a side portion of the LED in a friction fit to movably secure the LED cover in place.

15. The LED lamp of claim 13, wherein the side portion of each LED cover terminates in a clip portion that engages with the circuit board to secure the LED cover in place.

16. The LED lamp of claim 13, wherein each of the plurality of LED covers includes a side portion that reflects light, emitted from a side portion of the LED, toward the lens portion.

17. The LED lamp of claim 13, wherein at least two of the LED covers have lens portions that are shaped differently from each other in order to create different light distribution patterns emanating therefrom.

18. An LED lamp, comprising:
a circuit board;
a plurality of LEDs mounted to the circuit board that when activated emit a light output; and
a plurality of LED covers each mounted to cover one of the plurality of LEDs, each LED cover including a lens portion that assymetrically redirects the light output from the one LED;
wherein each of the plurality of LED covers includes a side portion that movably attaches to the LED so that the LED cover can be rotated relative to the LED to modify the asymmetrical redirection of the light output from the LED, and wherein for each LED cover, the side portion and the lens portion are separate elements that are movably attached to each other.

19. An LED lamp, comprising:
a housing;
a circuit board mounted to the housing;
an electrical connector attached to the housing and electrically connected to the circuit board;
a plurality of LEDs mounted to the circuit board that are activated to emit a light output when an electrical voltage is applied to the electrical connector; and
a plurality of LED covers each mounted to cover one of the plurality of LEDs, each LED cover including:
   a lens portion that asymmetrically redirects the light output from the one LED, and
   a side portion that movably attaches to the LED so that the LED cover can be rotated relative to the LED to modify the asymmetrical redirection of the light output from the LED.

20. The LED lamp of claim 19, wherein the side portion of each LED cover engages with a side portion of the LED in a friction fit to movably secure the LED cover in place.

21. The LED lamp of claim 19, wherein the side portion of each LED cover terminates in a clip portion that engages with the circuit board to secure the LED cover in place.

22. The LED lamp of claim 19, wherein for each of the plurality of LED covers, the side portion reflects light, emitted from a side portion of the LED, toward the lens portion.

23. The LED lamp of claim 19, wherein at least two of the LED covers have lens portions that are shaped differently from each other in order to create different light distribution patterns emanating therefrom.

24. An LED lamp, comprising:

a housing;

a circuit board mounted to the housing;

an electrical connector attached to the housing and electrically connected to the circuit board;

a plurality of LEDs mounted to the circuit board that are activated to emit a light output when an electrical voltage is applied to the electrical connector; and a plurality of LED covers each mounted to cover one of the plurality of LEDs, each LED cover including:

a lens portion that asymmetrically redirects the light output from the one LED, and a side portion that movably attaches to the LED so that the LED cover can be rotated relative to the LED to modify the asymmetrical redirection of the light output from the LED;

wherein for each LED cover, the side portion and the lens portion are separate elements that are movably attached to each other.

* * * * *